(12) United States Patent
Kontani

(10) Patent No.: US 9,385,631 B2
(45) Date of Patent: Jul. 5, 2016

(54) INVERTER UNIT

(71) Applicant: KABUSHIKI KAISHA TOYOTA JIDOSHOKKI, Kariya-shi, Aichi-ken (JP)

(72) Inventor: Kazuyoshi Kontani, Aichi-ken (JP)

(73) Assignee: KABUSHIKI KAISHA TOYOTA JIDOSHOKKI, Aichi-ken (JP)

(*) Notice: Subject to any disclaimer, the term of this patent is extended or adjusted under 35 U.S.C. 154(b) by 40 days.

(21) Appl. No.: 14/290,157

(22) Filed: May 29, 2014

(65) Prior Publication Data

US 2014/0355324 A1 Dec. 4, 2014

(30) Foreign Application Priority Data

May 31, 2013 (JP) ................................. 2013-115840

(51) Int. Cl.
*H02M 7/538* (2007.01)
*H02M 7/5387* (2007.01)
(Continued)

(52) U.S. Cl.
CPC ......... *H02M 7/53871* (2013.01); *H01L 25/072* (2013.01); *H01L 25/165* (2013.01); *H01L 25/18* (2013.01); *H02M 7/003* (2013.01); *H05K 1/0263* (2013.01); *H05K 7/1432* (2013.01); *H01L 2924/0002* (2013.01); *H02M 1/44* (2013.01); *H02M 7/5387* (2013.01);
(Continued)

(58) Field of Classification Search
CPC .......... H05K 7/00; H05K 2201/10962; H05K 2201/10287; H05K 2201/0397

USPC ................... 363/37, 39, 41, 96, 98, 131, 132; 361/388, 501, 707, 719, 752, 760
See application file for complete search history.

(56) References Cited

U.S. PATENT DOCUMENTS 5,699,609 A 12/1997 Wieloch
6,292,363 B1 9/2001 Shinohara et al.
(Continued)

FOREIGN PATENT DOCUMENTS

CN 1448669 A 10/2003
JP 621330 A 1/1994
(Continued)

OTHER PUBLICATIONS

Communication dated Oct. 29, 2014 from the European Patent Office in counterpart European Patent Application No. 14169943.9.
(Continued)

*Primary Examiner* — Rajnikant Patel
(74) *Attorney, Agent, or Firm* — Sughrue Mion, PLLC

(57) ABSTRACT

An inverter unit includes a first circuit board and a second circuit board arranged at a predetermined space so as to face each other. Each of the first circuit board and the second circuit board has a main circuit forming area. A plurality of power devices are mounted in the main circuit forming area of the first circuit board and form a main circuit. A plurality of capacitors are electrically connected to the plurality of the power devices and mounted in the main circuit forming area of the second circuit board. A control circuit controls the operation of the main circuit. The second circuit board includes a control circuit forming area separated from the main circuit forming area. The control circuit includes a first control circuit formed in the control circuit forming area of the second circuit board.

7 Claims, 4 Drawing Sheets

(51) Int. Cl.
*H01L 25/07* (2006.01)
*H01L 25/16* (2006.01)
*H01L 25/18* (2006.01)
*H02M 7/00* (2006.01)
*H05K 7/14* (2006.01)
*H05K 1/14* (2006.01)
*H02M 1/44* (2007.01)
*H05K 1/02* (2006.01)

(52) U.S. Cl.
CPC ............ *H05K 1/0231* (2013.01); *H05K 1/144* (2013.01); *H05K 2201/10166* (2013.01)

(56) References Cited

U.S. PATENT DOCUMENTS

| | | | | |
|---|---|---|---|---|
| 6,621,723 B1 * | 9/2003 | Karasawa | ........... | H02M 7/5387 |
| | | | | 363/132 |
| 7,471,525 B2 * | 12/2008 | Suzuki | ............... | H02M 5/4585 |
| | | | | 363/34 |
| 7,742,303 B2 * | 6/2010 | Azuma | ................... | B60L 3/12 |
| | | | | 361/699 |
| 8,063,594 B2 * | 11/2011 | Motoda | ............. | H02K 11/0073 |
| | | | | 318/400.01 |
| 8,279,620 B2 * | 10/2012 | Herron | .................. | H02M 7/003 |
| | | | | 361/784 |
| 2003/0182956 A1 | 10/2003 | Kurita et al. | | |
| 2004/0070381 A1 * | 4/2004 | Ando | .................. | H02M 3/1588 |
| | | | | 323/284 |
| 2006/0044848 A1 | 3/2006 | Suzuki et al. | | |
| 2007/0058310 A1 * | 3/2007 | Fan | ........................ | H02H 3/087 |
| | | | | 361/90 |
| 2010/0265742 A1 * | 10/2010 | Hu | .................... | H02M 3/33523 |
| | | | | 363/21.13 |

FOREIGN PATENT DOCUMENTS

| | | |
|---|---|---|
| JP | 10135650 A | 5/1998 |
| JP | 2000-133768 A | 5/2000 |
| JP | 2005257266 A | 9/2005 |
| JP | 2010239811 A | 10/2010 |
| JP | 2011130626 A | 6/2011 |
| JP | 2014117106 A | 6/2014 |

OTHER PUBLICATIONS

Communication dated Mar. 31, 2016, from the State Intellectual Property Office of People's Republic of China in counterpart Application No. 201410239378.7.

* cited by examiner

INVERTER UNIT

BACKGROUND OF THE INVENTION

The present invention relates to an inverter unit which has a pair of circuit boards arranged at a predetermined space to face each other.

Japanese Unexamined Patent Publication No. 2000-133768 discloses a power semiconductor module. The power semiconductor module includes an insulating metal substrate in which a metal plate, an insulating layer and copper foil patterns are laminated in this order. The copper foil patterns include a main circuit pattern area having power semiconductor devices such as IGBTs (Insulated Gate Bipolar Transistor) and a control circuit pattern area having control semiconductor devices. The main circuit pattern area and the control circuit pattern area are separated from each other by a linear separator.

In the above-described power semiconductor module wherein the main circuit pattern area having power semiconductor devices and the control circuit pattern area having control semiconductor devices are separated from each other by the linear separator, the noise developed by the switching of the power semiconductor devices can be suppressed from transmitting to the control semiconductor devices through the metal plate.

There has been an increasing demand for downsizing and increasing the output power of inverter units as a semiconductor module. To meet such demand, it is proposed that circuit components of the inverter unit including a plurality of power devices, a plurality of capacitors and control devices should be arranged separately on a plurality of circuit boards and such circuit boards should be arranged at a predetermined space from each other. In such an inverter unit, large current flows in the main circuit including the power devices and the capacitors while relatively small current flows in the control circuit including the control devices controlling the switching of the main circuit as compared to the current in the main circuit. Though the parts of an inverter unit have different sizes and shapes, mixed arrangement of parts for the main circuit and parts for the control circuit on a single circuit board of the inverter unit may enhance the mounting density of parts and realize downsizing of the inverter unit.

However, the above-described inverter units have problems that noise occurs during the switching of the power devices and high heat generation occurs due to large current flowing in the main circuit. Therefore, transmission of noise and heat to the control circuit of the inverter unit need be suppressed.

The present invention is directed to providing an inverter unit that suppresses the influence of the noise development of power devices and the heat generation of the main circuit on the control circuit of the inverter unit.

SUMMARY OF THE INVENTION

In accordance with an aspect of the present invention, an inverter unit includes a first circuit board and a second circuit board arranged at a predetermined space so as to face each other. Each of the first circuit board and the second circuit board has a main circuit forming area. A plurality of power devices are mounted in the main circuit forming area of the first circuit board and form a main circuit. A plurality of capacitors are electrically connected to the plurality of the power devices and mounted in the main circuit forming area of the second circuit board. A control circuit controls the operation of the main circuit. The second circuit board includes a control circuit forming area separated from the main circuit forming area. The control circuit includes a first control circuit formed in the control circuit forming area of the second circuit board.

Other aspects and advantages of the invention will become apparent from the following description, taken in conjunction with the accompanying drawings, illustrating by way of example the principles of the invention.

BRIEF DESCRIPTION OF THE DRAWINGS

The invention together with objects and advantages thereof, may best be understood by reference to the following description of the presently preferred embodiments together with the accompanying drawings in which.

Figure 1:
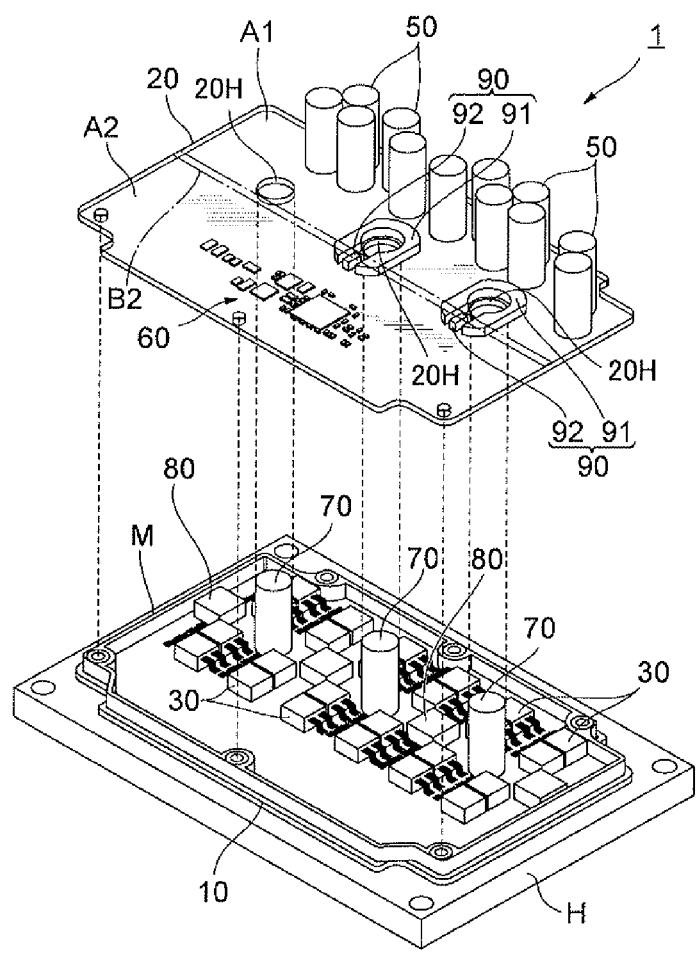
FIG. 1 is an exploded perspective view of an inverter unit according to an embodiment of the present invention.

The following will describe the inverter unit according to the embodiment of the present invention with reference to the accompanying drawings. In the drawings, the same parts or the parts having the same features are designated by the same symbols and the overlapping description thereof will be omitted. It is noted that some elements in the drawings are shown with dimensional ratio different from that of the actual element for the clarity of the drawings.

Referring to FIG. 1, numeral 1 designates an inverter unit according to the embodiment of the present invention. The inverter unit 1 is a three-phase inverter unit for driving a three-phase motor.

Figure 2:
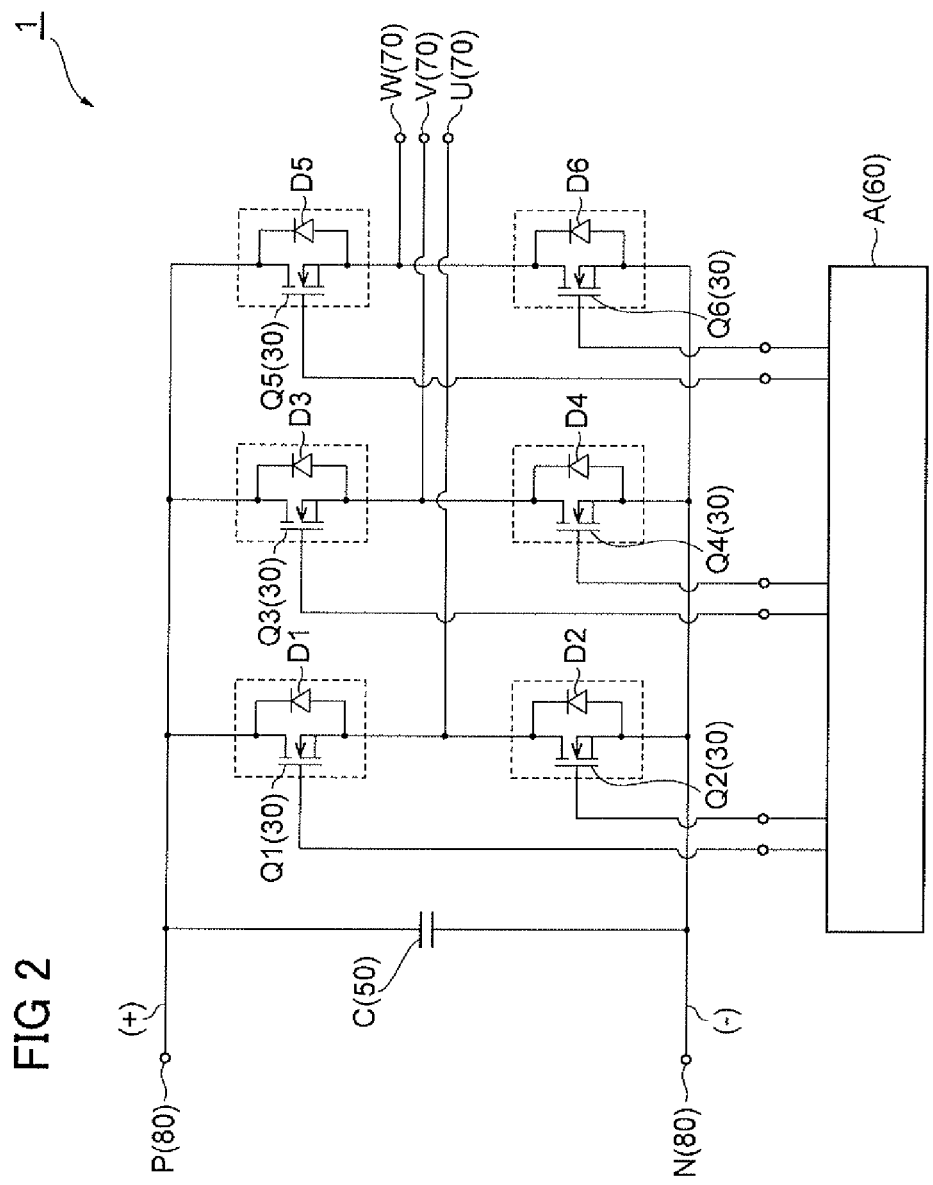
FIG. 2 is an equivalent circuit view of a main circuit of the inverter unit of FIG. 1.

As shown in FIG. 2, the main circuit of the inverter unit 1 is supplied with power across a positive input P and a negative input N and includes six power devices Q1, Q2, Q3, Q4, Q5, Q6 such as a MOSFET (Metal Oxide Semiconductor Field Effect Transistor) connected in three-phase bridge configuration and flywheel diodes D1, D2, D3, D4, D5, D6 connected in inversely parallel to the power devices Q1, Q2, Q3, Q4, Q5, Q6, respectively. IGBTs may be used as the power devices Q1, Q2, Q3, Q4, Q5, Q6.

The power devices Q1, Q2 are serially connected across the positive input P and the negative input N. A U-phase output U is connected to a junction between the power devices Q1, Q2. The power devices Q3, Q4 are serially connected across the positive input P and the negative input N. A V-phase output V is connected to a junction between the power devices Q3, Q4. The power devices Q5, Q6 are serially connected across the positive input P and the negative input N. A W-phase output W is connected to a junction between the power devices Q5, Q6.

A capacitor C is connected across the positive input P and the negative input N. The power devices Q1, Q2, Q3, Q4, Q5, Q6 are connected to a drive circuit A which controls the switching of each power device. In FIG. 2, the respective power devices Q1, Q2, Q3, Q4, Q5, Q6 equivalently denote device groups each including a plurality of power devices or, for example, four power devices connected in parallel to each other.

Figure 3A:
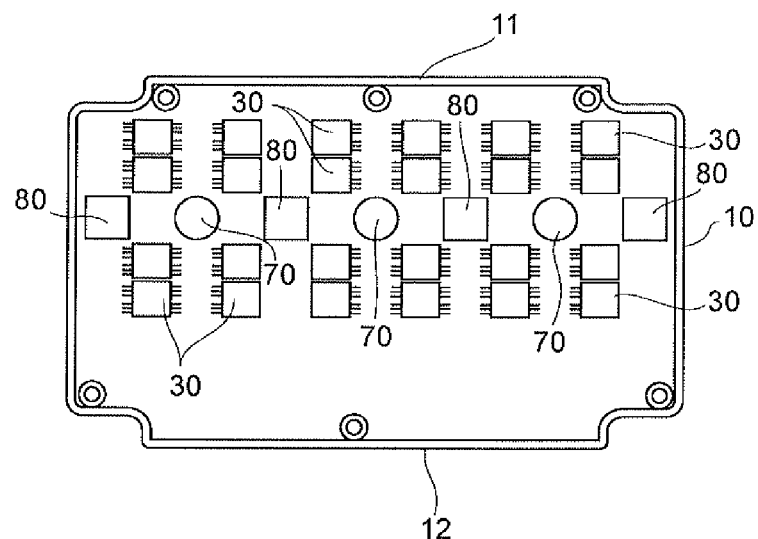
FIGS. 3A and 3B are plain views of a main circuit board and a capacitor circuit board shown in FIG. 1, respectively.
Figure 3B:
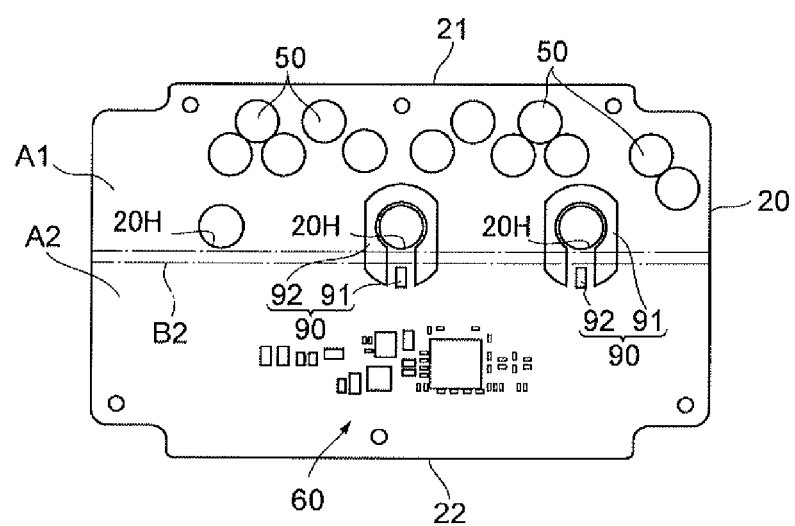

Referring to FIGS. 1, 3A and 3B, the following will describe the structure of the inverter unit 1. The inverter unit 1 includes a main circuit board 10 (a first circuit board), a capacitor circuit board 20 (a second circuit board), a plurality of power devices 30, a plurality of capacitors 50, a control circuit 60 (a first control circuit), a plurality of output terminals 70, a plurality of relay electrodes 80 and a plurality of current detectors 90.

The main circuit board 10 and the capacitor circuit board 20 are arranged in close proximity at a predetermined space by a spacer member M to face each other. The spacer member M is made of an insulating material such as resin or ceramic formed in a frame shape and arranged along the side edges of the main circuit board 10 and the capacitor circuit board 20. The spacer member M keeps constant the distance between the main circuit board 10 and the capacitor circuit board 20. The main circuit board 10 includes an IMS (Insulating Metal Substrate) and is disposed on a heat sink H which is formed of a flat metal plate such as aluminum or copper. The capacitor circuit board 20 includes a known printed circuit board.

The power devices 30 are mounted on the main circuit board 10. In the present embodiment, a plurality of power devices or, for example, four power devices 30 connected in parallel form an upper arm element and a lower arm element of each phase. Specifically, the power devices 30 correspond to the power devices Q1, Q2, Q3, Q4, Q5, Q6 in FIG. 2. The main circuit board 10 has a main circuit forming area in which the power devices 30 are mounted thereby to form part of the main circuit. The capacitors 50 are mounted on the capacitor circuit board 20 and electrically connected to the power devices 30. The capacitors 50 correspond to the capacitor C shown in FIG. 2. The capacitor circuit board 20 has a main circuit forming area (described later as the area A1) in which the capacitors 50 are mounted.

The control circuit 60 is formed on the capacitor circuit board 20 and used for various controlling purposes e.g. controlling the switching of the power devices 30 of the main circuit of the main circuit board 10. The control circuit 60 corresponds to a part of the drive circuit A in FIG. 2. The output terminals 70 of the respective phases, or U-phase, V-phase, W-phase are arranged on the main circuit board 10 and project through holes 20H formed in the capacitor circuit board 20. The output terminals 70 correspond to U-phase, V-phase and W-phase output terminals in FIG. 2.

The relay electrodes 80 are mounted on the main circuit board 10 and electrically connected to predetermined wiring patterns on the capacitor circuit board 20 when the main circuit board 10 and the capacitor circuit board 20 are assembled together in facing relation to each other. The relay electrodes 80 correspond to the positive input P and the negative input N in FIG. 2.

The current detectors 90 are arranged on the capacitor circuit board 20 for detecting output current from the main circuit. Specifically, each current detector 90 is composed of a U-shaped core 91 made of a magnetic steel plate and formed around the output terminal 70 and a current detecting element 92 disposed in the opening between the opposite ends of the U-shaped core 91. A hall element is used as the current detecting element 92.

As shown in FIG. 3B, the capacitor circuit board 20 has a substantially rectangular plate shape. The capacitor circuit board 20 is formed by an area A1 (the main circuit forming area) and an area A2 (the control circuit forming area) which are arranged separately extending along the long sides 21, 22 of the rectangular capacitor circuit board 20. Each of the areas A1 and A2 is of a substantially rectangular shape.

The area A1 and the area A2 are separated from each other by a substantially linear boundary region B2 (a second boundary region) extending along the long sides of the rectangular capacitor circuit board 20. For example, the boundary region B2 may be formed by a straight cut formed in the wiring pattern of the capacitor circuit board 20. The holes 20H of the capacitor circuit board 20 are formed in the area A1 of the capacitor circuit board 20.

The capacitors 50 are arranged in the area A1 of the capacitor circuit board 20. The holes 20H are formed in the area A1 of the capacitor circuit board 20 as described above, so that the output terminals 70 projecting from the holes 20H are also arranged in the area A1 of the capacitor circuit board 20. Terminals (not shown in the drawing) for electrical connection to the relay electrodes 80 are also arranged in the area A1 of the capacitor circuit board 20. The control circuit 60 is arranged in the area A2 of the capacitor circuit board 20.

Thus, in the capacitor circuit board 20, the components such as the capacitors 50 and the output terminals 70 of the main circuit in which relatively large current flows are collectively arranged in the area A1, while the control circuit 60 in which relatively small current flows is arranged in the area A2 of the capacitor circuit board 20. That is, in the capacitor circuit board 20, the main circuit and the control circuit are arranged separately from each other.

As described above, the inverter unit 1 includes the main circuit board 10 and the capacitor circuit board 20 that are arranged at a predetermined space to face each other, the power devices 30 arranged on the main circuit board 10, the capacitors 50 and the control circuit 60 arranged on the capacitor circuit board 20. Specifically, the capacitor circuit board 20 has the area A1 and the area A2 that are separate from each other. The capacitors 50 are arranged in the area A1 and the control circuit 60 is arranged in the area A2 of the capacitor circuit board 20, respectively.

That is, in the capacitor circuit board 20, the capacitors 50 that compose the main circuit with the power devices 30 and in which main current flows and the control circuit 60 in which control current flows are arranged separately without being mixed on the capacitor circuit board 20. The capacitor circuit board 20 has two separate areas namely the area A1 in which large current flows and the area A2 in which small current flows. Therefore, the inverter unit 1 according to the present embodiment can reduce its size and suppress the influence of the noise developed during switching of the power devices 30 and of the heat of the main circuit on the control circuit 60 by the separate arrangement of the power devices 30 in the main circuit board 10, the capacitors 50 and the control circuit 60 in the capacitor circuit board 20.

In the inverter unit 1, the provision of the area A1 and the area A2 divided from each other by the substantially linear boundary region B2 permits separate arrangement of the area in which large current flows and the area in which small current flows. Furthermore, the provision of the current detecting elements 92 in the area A2 permits increased detection sensitivity of the current detectors 90 by suppressing the influence of noise.

The above-described embodiment has dealt with an embodiment of the inverter unit according to the present invention. The present invention is not limited to the above-described embodiment, but it may be practiced in various ways as exemplified below.

Figure 4A:
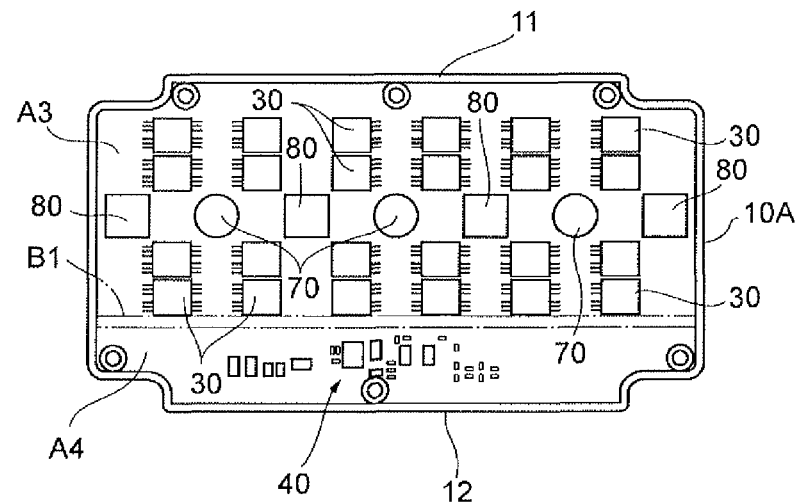
FIGS. 4A and 4B are plain views of a main circuit board and a capacitor circuit board, respectively, according to a variation of the embodiment of the present invention.
Figure 4B:
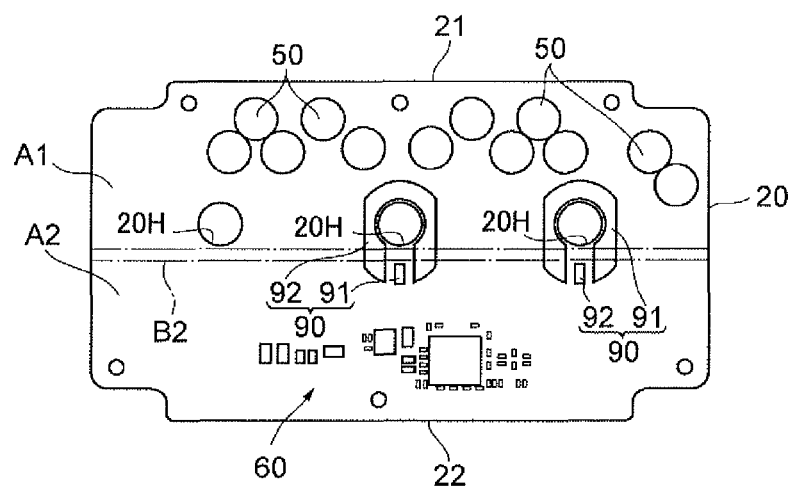

Referencing to FIGS. 4A and 4B, an inverter unit 1 according to a variation of the first embodiment of the present invention includes a main circuit board 10A corresponding to the main circuit board 10 of FIG. 1 and a control circuit 40 which is formed on the main circuit board 10A as a second control circuit and corresponds to a part of the control circuit 60 on the capacitor circuit board 20 of FIG. 1. The control circuit 40 may be a drive circuit A controlling the switching of the power devices 30.

Like the capacitor circuit board 20, the main circuit board 10A has a substantially rectangular plate shape. The main circuit board 10A is separated into an area A3 (a main circuit forming area) and an area A4 (a control circuit forming area) by a boundary region B1 (a first boundary region) extending along the long sides 11, 12 of the rectangular main circuit board 10A. The area A3 and the area A4 are of a substantially rectangular shape.

The power devices 30, the output terminals 70 and the relay electrodes 80 are arranged in the area A3 of the main circuit board 10A. Specifically, four power devices 30 for each arm element are disposed in the area A3 of the main circuit board 10A along the short sides of the rectangular main circuit board 10A. The output terminals 70 and the relay electrodes 80 are arranged in the center of the area A3 that extends along the long sides of the main circuit board 10A and between two groups of the power devices 30 for the respective arm elements, namely one group of power devices 30 adjacent to the long side 11 of the main circuit board 10A and the other group adjacent to the boundary region B1. The control circuit 40 is arranged in the area A4 of the main circuit board 10A.

Thus, in the main circuit board 10A, the components such as the power devices 30, the output terminals 70 and the relay electrodes 80 that compose the main circuit and in which relatively large current flows are collectively arranged in the area A3, while the control circuit 40 in which relatively small current flows is arranged in the area A4 of the main circuit board 10A. That is, in the main circuit board 10A, the main circuit and the control circuit are also arranged separately from each other.

With the main circuit board 10A and the capacitor circuit board 20 assembled together, the area A1 of the capacitor circuit board 20 is positioned to face the area A3 of the main circuit board 10A and the area A2 of the capacitor circuit board 20 is positioned to face the area A4 of the main circuit board 10A. Therefore, the areas A1, A2 of the capacitor circuit board 20 are formed extending in the same direction as the areas A3, A4 of the main circuit board 10A. That is, the area A3 of the main circuit board 10A and the area A1 of the capacitor circuit board 20 are positioned on the same side of the inverter unit 1. The areas A1, A2 of the capacitor circuit board 20 are separated by the boundary region B2 extending in the same direction as the boundary region B1 of the main circuit board 10A.

As described above, the capacitors 50 are arranged in the area A1 of the capacitor circuit board 20. With the main circuit board 10A and the capacitor circuit board 20 assembled together in facing relation, the power devices 30 on the main circuit board 10A and the capacitors 50 on the capacitor circuit board 20 are arranged in close proximity to face each other.

The inverter unit 1 according to the above-described variation of the embodiment of the present invention includes the main circuit board 10A and the capacitor circuit board 20 that are arranged at a predetermined space to face each other, the power devices 30 and the control circuit 40 arranged on the main circuit board 10A, and the capacitors 50 and the control circuit 60 arranged on the capacitor circuit board 20. The main circuit board 10A has the area A3 and the area A4 that are separated from each other. The capacitor circuit board 20 has the area A1 and the area A2 that are separated from each other.

In the main circuit board 10A, the power devices 30 and the control circuit 40 are arranged separately in the area A3 and the area A4, respectively. In the capacitor circuit board 20, the capacitors 50 and the control circuit 60 are arranged separately in the area A1 and the area A2, respectively. That is, the power devices 30 and the capacitors 50 that compose the main circuit, and the control circuits 40, 60 are arranged separately without being mixed on the main circuit board 10A and the capacitor circuit board 20, respectively. Therefore, the inverter unit 1 according to the variation of the embodiment of the present invention permits to suppress the influence of the noise development and the heat generated in the main circuit on the control circuit.

In the inverter unit 1 according to the variation of the embodiment of the present invention, with the main circuit board 10A and the capacitor circuit board 20 assembled in close proximity to face each other, the power devices 30 on the main circuit board 10A and the capacitors 50 on the capacitor circuit board 20 are positioned in close proximity to face each other. With the main circuit board 10A and the capacitor circuit board 20 assembled together, the output terminals 70 and the relay electrodes 80 are located in the area A3 of the main circuit board 10A and in the area A1 of the capacitor circuit board 20. In the inverter unit 1 according to the variation of the embodiment of the present invention wherein the main circuit is arranged collectively, the circuit inductance of the main circuit is reduced and the pattern length of the main circuit is shortened, with the result that the noise development and the heat generation in the main circuit are suppressed.

In the inverter unit 1 according to the variation of the embodiment of the present invention wherein a part of the control circuit, or the control circuit 40, also arranged on the main circuit board 10A, mounting parts with high density and reduction in size of the inverter unit may be achieved. As compared to a case that the control circuit is arranged only on the capacitor circuit board 20, arrangement of parts of the control circuit both on the capacitor circuit board 20 and the main circuit board 10 permits to reduce the size of the capacitor circuit board 20 and the main circuit board 10. Furthermore, in the inverter unit 1 according to the variation of the embodiment of the present invention wherein the area A3 and the area A4 of the main circuit board 10A are separated from each other by the boundary region B1, the area in which large current flows (area A3) and the area in which small current flows (area A4) are separated.

Furthermore, in the inverter unit 1 according to the variation of the embodiment of the present invention, the areas A1, A3 in which large current flows and the areas A2, A4 in which small current flows are separated not only in the main circuit board 10A and the capacitor circuit board 20, respectively, but also in the entire inverter circuit 1. As a result, the influence of the noise development due to the switching of the power devices 30 and the heat generation of the main circuit on the control circuit can be suppressed effectively.

What is claimed is:

1. An inverter unit comprising:
    a first circuit board and a second circuit board arranged at a predetermined space to face each other and having respective main circuit forming areas;
    a plurality of power devices mounted in the main circuit forming area of the first circuit board;
    a main circuit including the plurality of power devices;
    a plurality of capacitors electrically connected to the plurality of the power devices and mounted in the main circuit forming area of the second circuit board; and
    a control circuit controlling the operation of the main circuit, wherein the second circuit board includes a control circuit forming area separated from the main circuit forming area and the control circuit includes a first control circuit formed in the control circuit forming area on the second circuit board, wherein an output terminal connected to a junction between the power devices is arranged on the first circuit board.

2. The inverter unit according to claim 1, wherein the first circuit board includes a control circuit forming area separated from the main circuit forming area, wherein the control circuit includes a second control circuit formed in the control circuit forming area on the first circuit board.

3. The inverter unit according to claim 2, wherein the main circuit forming area and the control circuit forming area on the first circuit board are separated from each other by a first substantially linear boundary region, wherein the main circuit forming area and the control circuit forming area on the second circuit board are separated from each other by a second substantially linear boundary region extending in the same direction as an extending direction of the first boundary region.

4. The inverter unit according to claim 1, wherein the main circuit forming area on the first circuit board and the main circuit forming area on the second circuit board are positioned on the same side of the inverter unit.

5. The inverter unit according to claim 1, further comprising:
a current detector detecting output current from the main circuit, wherein a current detecting element of the current detector is disposed in the control circuit forming area of the second circuit board.

6. The inverter unit according to claim 1, wherein the output terminal projects through the main circuit forming area on the second circuit board.

7. The inverter unit according to claim 6, further comprising:
a current detector detecting output current from the main circuit, wherein a current detecting element of the current detector is disposed in the control circuit forming area of the second circuit board.

* * * * *